United States Patent
Sun et al.

(10) Patent No.: US 11,557,999 B2
(45) Date of Patent: Jan. 17, 2023

(54) DYNAMIC PULSE WIDTH MODULATION UPDATE

(71) Applicant: Ford Global Technologies, LLC, Dearborn, MI (US)

(72) Inventors: Xuemei Sun, Canton, MI (US); Jiyao Wang, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 191 days.

(21) Appl. No.: 17/149,480

(22) Filed: Jan. 14, 2021

(65) Prior Publication Data

US 2022/0224272 A1 Jul. 14, 2022

(51) Int. Cl.
*H02M 1/38* (2007.01)
*H02P 27/08* (2006.01)
*H02M 7/5387* (2007.01)
*G01R 31/42* (2006.01)
*H03K 7/08* (2006.01)
*G01R 19/00* (2006.01)

(52) U.S. Cl.
CPC .......... *H02P 27/08* (2013.01); *G01R 19/0092* (2013.01); *G01R 31/42* (2013.01); *H02M 1/38* (2013.01); *H02M 7/5387* (2013.01); *H03K 7/08* (2013.01)

(58) Field of Classification Search
CPC ....... H02M 1/38; H02M 7/5387; H02P 27/08; H03K 7/08; G01R 31/42; G01R 19/0092
See application file for complete search history.

(56) References Cited

U.S. PATENT DOCUMENTS

| 7,023,268 B1 * | 4/2006 | Taylor ..................... H03F 3/217 330/10 |
| 7,804,379 B2 | 9/2010 | Kris et al. |
| 9,553,540 B2 | 1/2017 | Degner et al. |
| 2009/0278621 A1 * | 11/2009 | Kris ......................... H03K 7/08 332/109 |
| 2017/0093283 A1 * | 3/2017 | Leoncini ................. H02M 1/44 |

FOREIGN PATENT DOCUMENTS

| DE | 102014114656 A1 * | 5/2015 | ............ H02M 7/487 |
| JP | 6486139 B2 | 3/2019 | |

* cited by examiner

*Primary Examiner* — Harry R Behm
(74) *Attorney, Agent, or Firm* — David B. Kelley; Brooks Kushman P.C.

(57) ABSTRACT

A control method includes sequentially updating a next cycle pulse width modulation command for each of an upper switch and lower switch of a phase leg of a power converter according to an order defined by timing of a rising edge of the next cycle pulse width command for one of the switches relative to a rising edge of a previous cycle pulse width command for the one of the switches.

17 Claims, 5 Drawing Sheets

DYNAMIC PULSE WIDTH MODULATION UPDATE

TECHNICAL FIELD

This disclosure relates to vehicle power electronic components.

BACKGROUND

Certain automotive vehicles may include traction batteries that provide energy to and store energy from one or more electric machines. A power converter may be used to convert DC power from the traction battery to AC power for use by the one or more electric machines, and vice versa.

SUMMARY

A powertrain system has a traction battery, an electric machine, and a power converter that transfers energy between the traction battery and electric machine, and includes an upper switch and a lower switch forming a phase leg. The powertrain system also has a controller that sequentially updates a next cycle pulse width modulation command for each of the upper switch and lower switch according to an order defined by whether the next cycle pulse width modulation command for one of the switches rises earlier than a previous cycle pulse width modulation command for the one of the switches.

A method includes sequentially updating a next cycle pulse width modulation command for each of an upper switch and lower switch of a phase leg of a power converter according to an order defined by timing of a rising edge of the next cycle pulse width command for one of the switches relative to a rising edge of a previous cycle pulse width command for the one of the switches.

A control system for a power converter, having a phase leg with an upper switch and a lower switch, includes a controller that first updates a next cycle pulse width modulation command for the lower switch and then updates the next cycle pulse width modulation command for the upper switch responsive to timing of the next cycle pulse width modulation command for the upper switch indicating an earlier rise than the previous cycle pulse width modulation command for the upper switch.

DETAILED DESCRIPTION

The disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

In power converters, a half-bridge phase leg is a fundamental building block. One half-bridge phase leg can include two power electronic switches (i.e., the upper and lower switches). In an electrified vehicle, there may be multiple power converters including traction motor drives and variable voltage converters that use such half-bridge phase legs.

Figure 1:
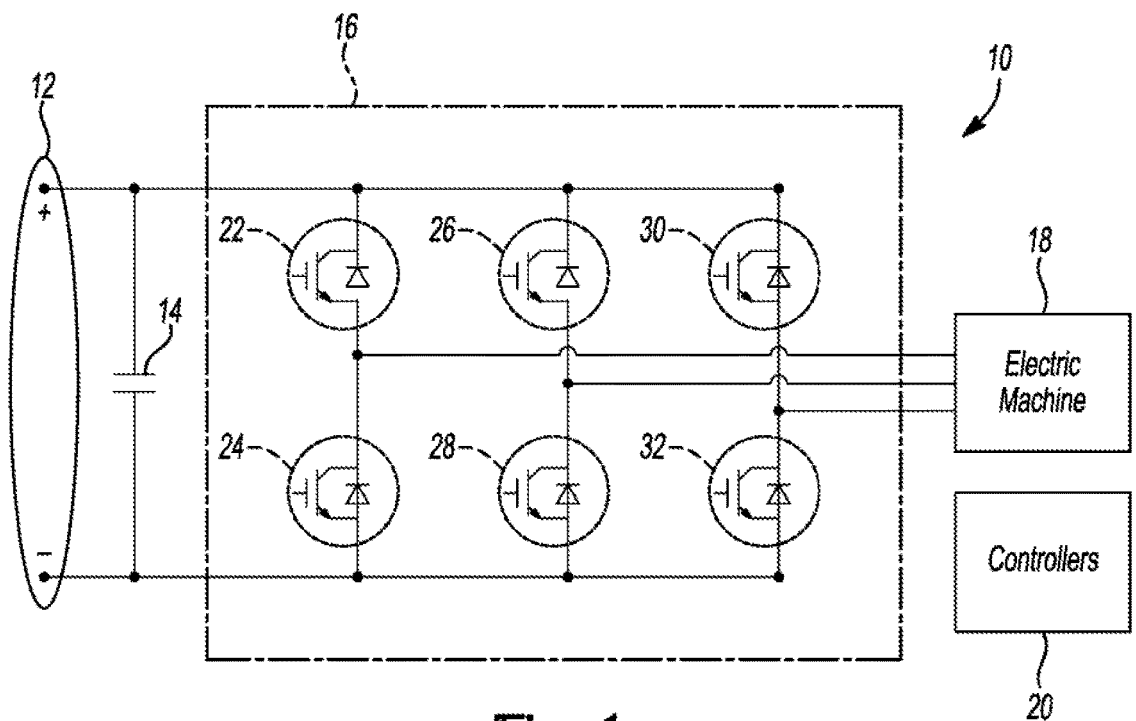
FIG. 1 is a schematic diagram of a powertrain system that includes a traction motor drive having three half-bridge phase legs.

Referring to FIG. 1, a powertrain system 10 for a vehicle includes terminals 12 for connection to a traction battery, an output capacitor 14, a traction motor drive 16, a three phase electric machine 18, and one or more controllers 20. The output capacitor 14 is electrically between the terminals 12 and traction motor drive 16. The traction motor drive 16 is electrically between the output capacitor 14 and electric machine 18. And, the controllers 20 are in communication with/exert control over the traction motor drive 16 and electric machine 18.

The traction motor drive 16 includes switches 22, 24, 26, 28, 30, 32. The switches 22, 24 form a first half-bridge phase leg. The switches 26, 28 form a second half-bridge phase leg. And, the switches 30, 32 form a third half-bridge phase leg. In this example, the switches 22, 26, 30 are upper switches, and the switches 24, 28, 32 are lower switches.

Figure 2:
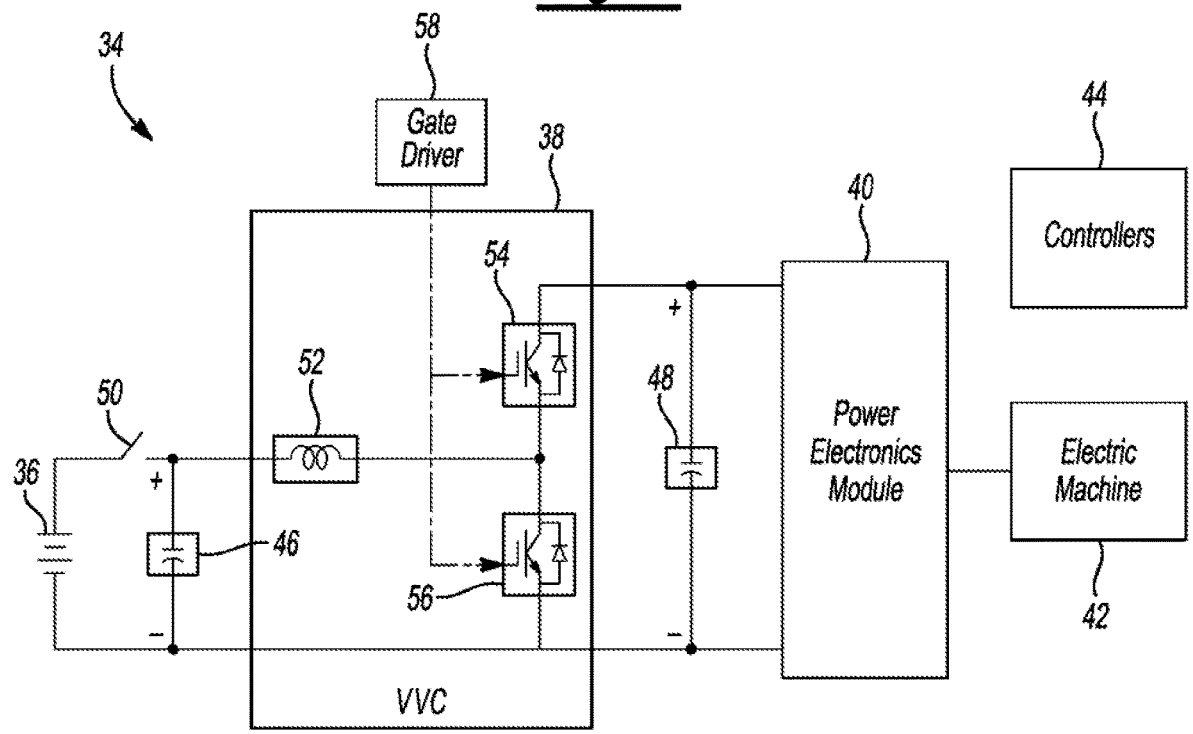
FIG. 2 is a schematic diagram of a powertrain system that includes a variable voltage converter having one half-bridge phase leg.

Referring to FIG. 2, a powertrain system 34 for a vehicle includes a traction battery 36, a variable voltage converter 38, a power electronics module 40, electric machines 42, and one or more controllers 44. The powertrain system 34 also includes voltage sensors 46, 48, and a contactor 50. The variable voltage converter 38 is electrically between the traction battery 36 and power electronics module 40. The power electronics module 40 is electrically between the variable voltage converter 38 and the electric machines 42. And the controllers 44 are in communication with/exert control over the traction battery 36, variable voltage converter 38, power electronic module 40, electric machines 42, voltage sensors 46, 48, and contactor 50.

The variable voltage converter 38 includes an inductor 52, switches 54, 56, and a gate driver 58. The switches 54, 56 form a half-bridge phase leg, with the switch 54 being the upper switch and the switch 56 being the lower switch.

Figure 3:
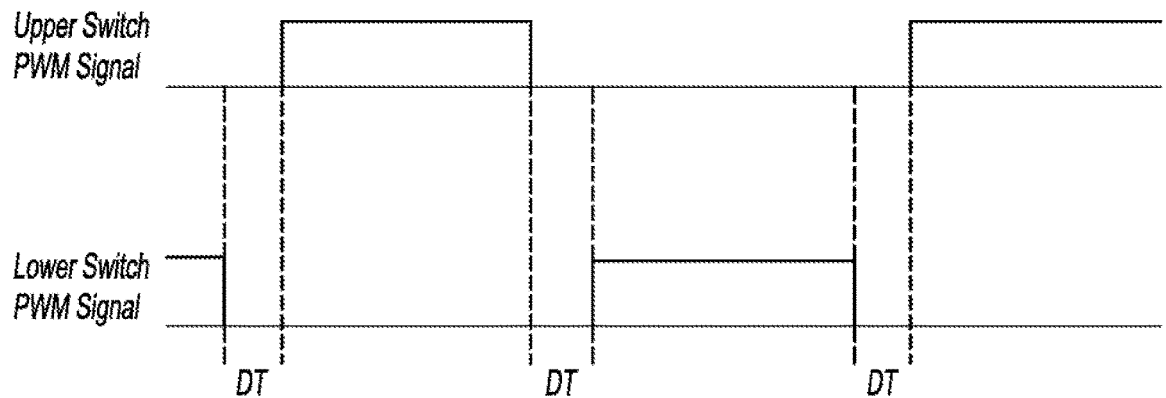
FIG. 3 are traces of pulse width modulated signals with dead time.

In a half-bridge phase leg, it may be desirable to avoid the upper and lower switches turning on at the same time. Otherwise, there may be be a short circuit and current flow in the phase leg (shoot-through). To prevent shoot-through, a pair of complementary pulse width modulated (PWM) signals should feed the upper and lower switches. Referring to FIG. 3, sufficient deadtime (DT), during which both switches are turned off, should be inserted between the ON states of the switches.

There are several methods to ensure correct deadtime insertion. Some gate drivers (in the form of integrated circuit chips) can perform hardware deadtime insertion, and some microcontrollers have internal PWM modules with hardware deadtime insertion functionality. These hardware-based deadtime insertion methods can be generally robust but costly.

As an alternative to hardware-based deadtime insertion, there are software-based deadtime insertion methods in which software running in the microcontroller is responsible for providing correct PWM commands (typically in the form of number of counts of the hardware PWM counter) to the PWM modules. Software-based deadtime insertion can be more cost effective and more flexible than hardware-based methods. Certain existing software-based dead time insertion methods may experience potential issues under some operating conditions. Here, robust methods of PWM generation are proposed to ensure deadtime insertion and prevent shoot-through conditions.

Typically, application software starts running at the beginning of a PWM cycle. After the computation is done, the software provides valid values of the PWM commands in the form of PWM cycle counts and duty cycle counts. These PWM commands have no information concerning deadtime. Then, the software deadtime insertion module reads the PWM commands and inserts the appropriate deadtime information. It next generates a pair of complementary PWM commands for the upper switch and lower switch respectively. Finally, the software will copy the complementary PWM commands into registers of the microcontroller. At the end of each PWM cycle (i.e., the beginning of the next cycle), the hardware PWM module will read the upper and lower PWM commands from the microcontroller registers. Based on the register values, the PWM hardware module will generate the PWM signals (i.e., the square waves with deadtime as shown in FIG. 3, for the next PWM cycle.) This process repeats for every PWM cycle, and as long as the software finishes copying to the registers within the current PWM cycle, the hardware PWM module can load correct values from the registers. PWM generation is always correct in this case.

Such software, however, can be complex. And under certain conditions, it may not be able to finish all its tasks on time. For example, the software may be interrupted by other tasks that have higher priorities, the software by itself may experience a longer logic loop than expected, or the RAM of the microcontroller may be delayed. This may cause a signal integrity issue if the hardware PWM module reads the registers before the software copies all values into the registers. For example, immediately after the software copies the new upper PWM commands into the registers, the hardware may read the PWM commands from the registers. In this case, the hardware gets the new upper PWM commands and the previous lower PWM commands. Because the upper commands and lower commands are not consistent, the actual deadtime may be wrong: Insufficient deadtime may cause shoot-through.

Hardware loading time is generally predetermined, so it may not be possible to change it during runtime. The hardware is triggered at the beginning of the next PWM cycle, regardless of whether the software of the previous cycle finishes.

A simple software solution may be to absolutely avoid the software from running overtime by using a more advanced microcontroller. This solution, however, is expensive because the microcontroller needs a significant margin on top of normal operation. Another solution may be to check the hardware reading time in the software, and to halt the software copying into the register if the hardware read time is too close. In multi-task complex software however, there are many tasks. It may thus be difficult to predict the hardware reading time in software, especially for a low priority task that gets interrupted at unpredictable times.

Other methods may be designed to guarantee the hardware PWM module always reads consistent register values (i.e., the upper PWM commands and the lower PWM commands) from the software. By comparison, the algorithms proposed here do not guarantee that the hardware will read consistent register values. Instead, they seek to guarantee that the hardware, when reading inconsistent values, will not cause shoot-through. Some of the proposed sequences may offer several advantages including robustly preventing shoot-through when the software runs overtime or gets interrupted by higher priority tasks, no need to predict hardware reading times, no need for additional hardware, and negligible computational burden.

In a conventional register update sequence, the update order is fixed. For example, the upper PWM commands are updated first, then the lower PWM commands. By comparison, in the proposed algorithms, the software will determine the register update order for each PWM cycle. After the order is determined, the software will update the register according to the order.

When the software runs overtime and the hardware reads the register before the software finishes the update, there will be new values in part of the register and previous values in the other part of the register. The proposed algorithm provides a correct order to guarantee the new values and previous values will not cause shoot-through. The new and previous values may still be inconsistent and cause degradation of software performance, but shoot-through conditions are avoided.

Figure 4:
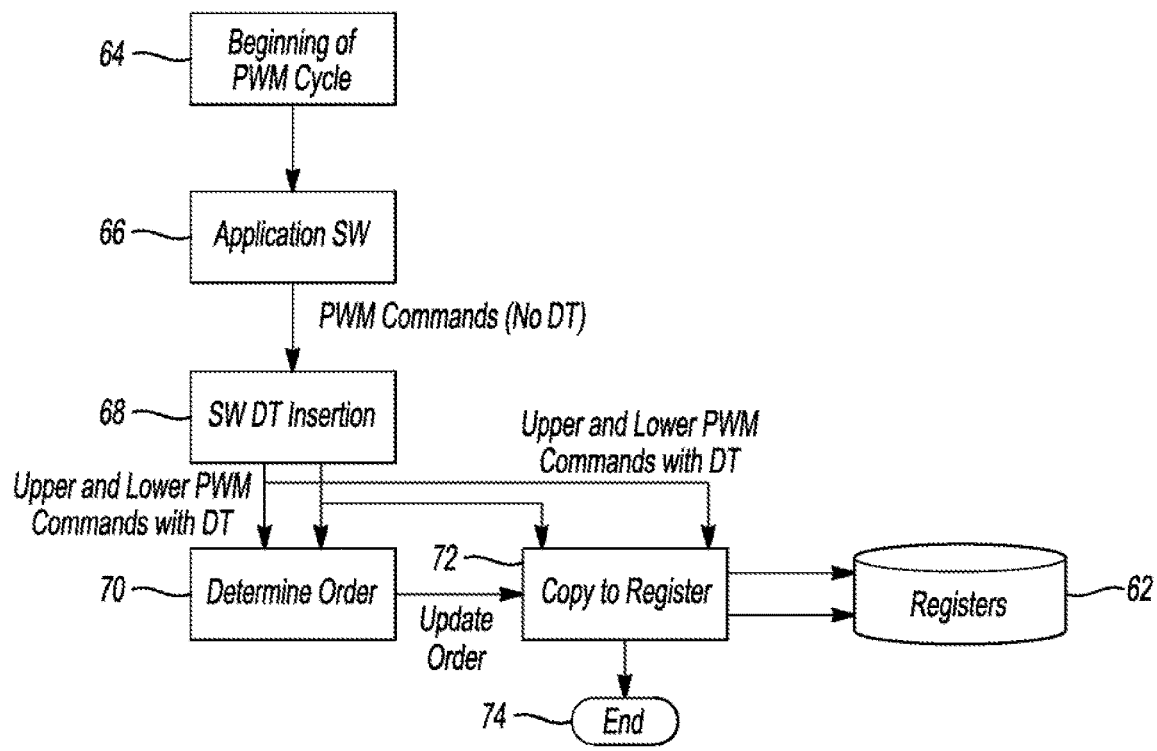
FIG. 4 is a flow chart of an algorithm for generating and storing pulse width modulation commands.

Referring to FIG. 4, a PWM generation algorithm that can reside for example on the controllers 20, 44 of FIGS. 1, 2 respectively, executes to update registers 62, which can be associated with the controllers 20, 44. At operation 64, the algorithm initiates with the beginning of the PWM cycle. At operation 66, the PWM commands are determined for the next PWM cycle in known fashion. No deadtime information is present at this time. At operation 68, dead time insertion is performed in known fashion. At operation 70, the order for updating the registers 62 with next cycle PWM commands for the upper and lower switches is determined. The upper and lower PWM commands with the deadtime information at operation 72 are copied to the registers 62. At operation 74, the algorithm ends.

Figure 5:
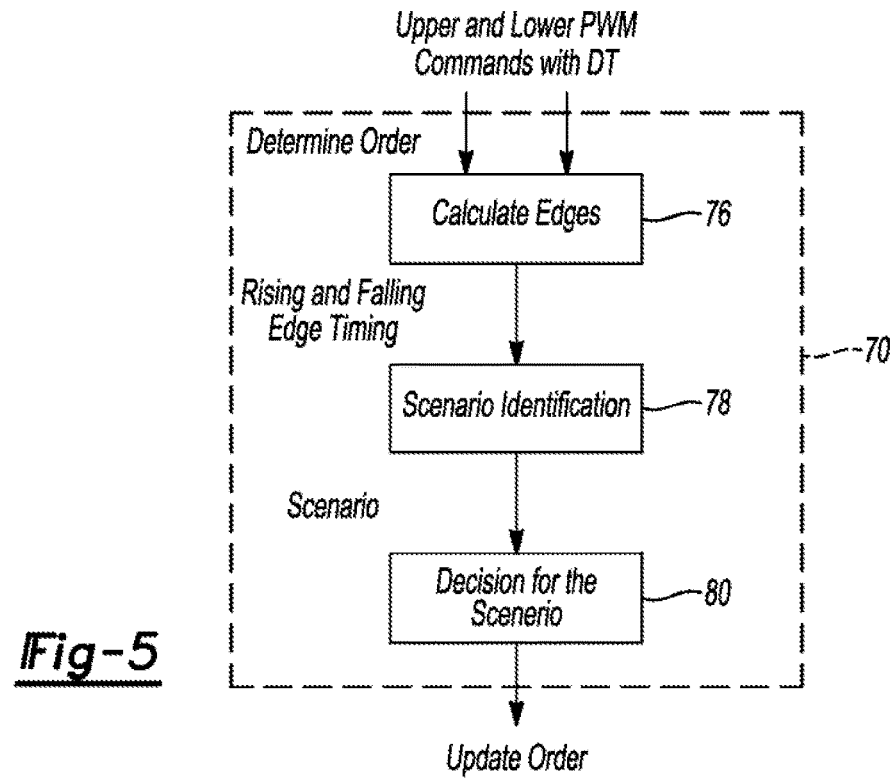
FIG. 5 is a flow chart of a portion of the algorithm of FIG. 4 in which an update order for pulse width modulation command registers is determined.

Referring to FIG. 5, the upper and lower PWM commands are received at operation 70. Several sub-operations are then performed. At sub-operation 76, the rising and falling edge timing for the upper and lower switches is calculated based on the PWM commands. The calculation should be consistent with the behavior of the PWM hardware module of the microcontroller—so it is hardware dependent, but known and straightforward for a person of ordinary skill with knowledge of such PWM commands. At sub-operation 78, one of four possible rising and falling edge scenarios is identified. And at sub-operation 80, a decision as to whether to first update the registers with the PWM commands for the upper switches followed next by the PWM commands for the lower switches, or vice versa, is made.

Referring to FIGS. 6A through 6D and as mentioned above, there are four possible rising and falling edge scenarios, each with an associated register update sequence for the upper and lower switches.

Figure 6A:
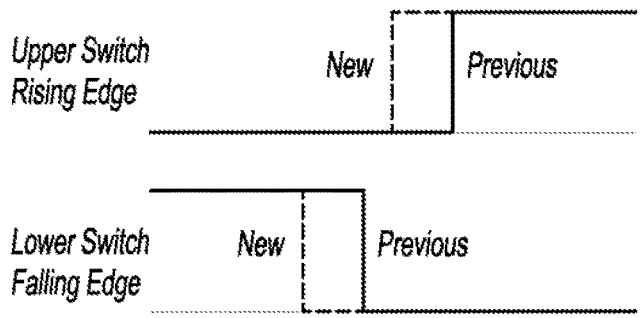
FIG. 6A are traces of pulse width modulated signals for upper and lower switches in which the command rises earlier for the upper switch.
Figure 6B:
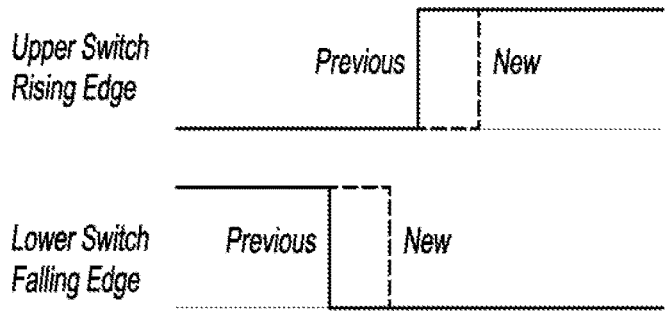
FIG. 6B are traces of pulse width modulated signals for upper and lower switches in which the command rises later for the upper switch.
Figure 6C:
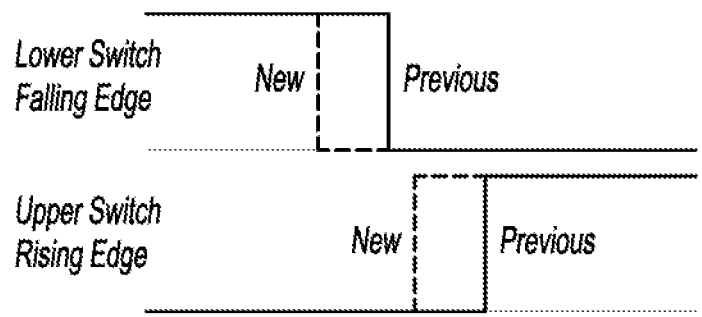
FIG. 6C are traces of pulse width modulated signals for upper and lower switches in which the command rises earlier for the lower switch.
Figure 6D:
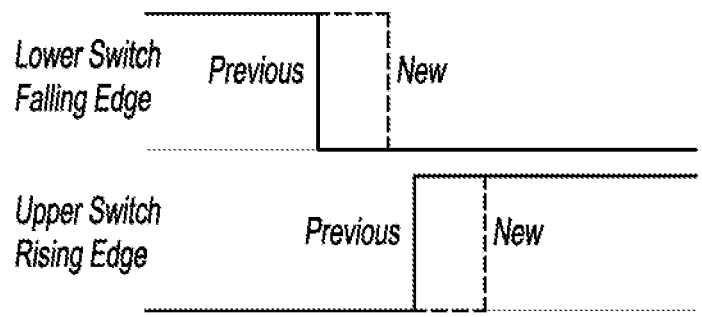
FIG. 6D are traces of pulse width modulated signals for upper and lower switches in which the command rises later for the lower switch.

In FIG. 6A, the new upper switch command rises earlier than the previous cycle: The sequence is to update the registers with the new PWM commands for the lower switch first, then the upper switch. In FIG. 6B, the new upper switch command rises later than the previous cycle: The sequence is to update the registers with the new PWM commands for upper switch first, then the lower switch. In FIG. 6C, the new lower switch command rises earlier than the previous cycle: The sequence is to update the new PWM commands for the upper switch first, then the lower switch. In FIG. 6D, the new lower switch command rises later than the previous cycle: The sequence is to update the new PWM commands for the lower switch first, then the upper switch.

Figure 7A:
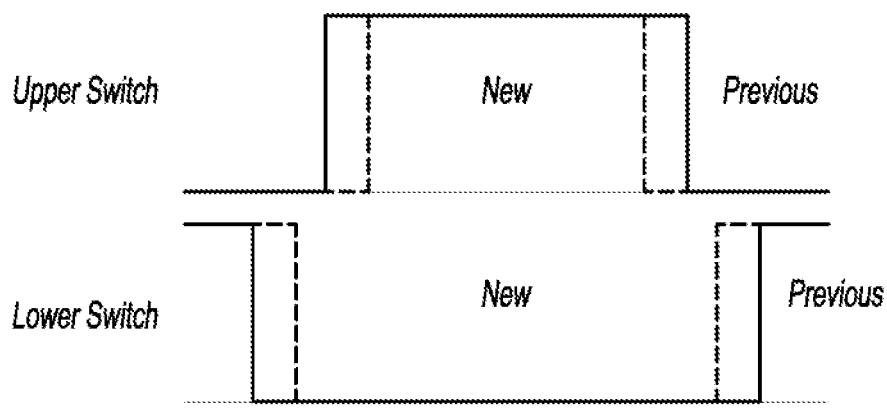
FIGS. 7A and 7B are traces of previous and new pulse width modulated signals under a synchronous update scheme.
Figure 7B:
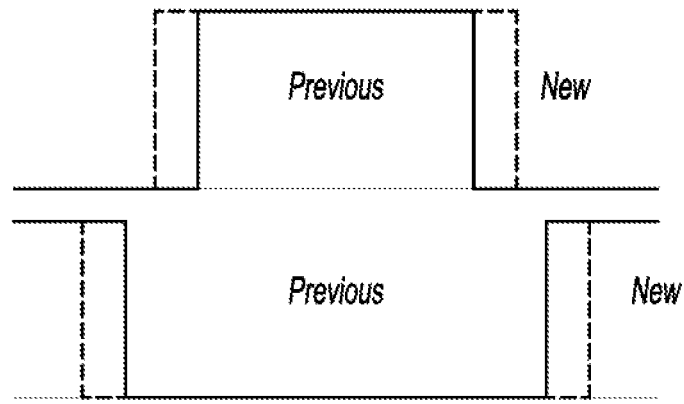

Referring to FIGS. 7A and 7B, in some implementations, the PWM commands will decide both the rising and falling edges for the next PWM cycle, so the scenario identification is different than that associated with FIGS. 6A through 6D. For this type: of PWM implementation, there are only two scenarios. In FIG. 7B, the new upper switch command rises earlier than the previous cycle: The sequence is to update the new PWM commands for the lower switch first, then the upper switch. In FIG. 7A, the new upper switch command rises later than the previous cycle: The sequence is to update the PWM commands for the upper switch first, then the lower switch.

Referring again to FIG. 4, after determining the sequential update order for the upper and lower switches, the respective PWM commands will be saved to registers 62 according to the update order as mentioned above.

There may be three possible results associated with the algorithms contemplated. For any one of them, the PWM signals do not cause shoot-through conditions. If the software does not run overtime, i.e., the software execution time does not exceed the current PWM cycle, then all the new PWM commands will be copied to the registers, and the PWM hardware module will select the new commands and generate PWM signals according to the new PWM commands. If the software runs completely overtime, then none of the new PWM commands will have been copied to the registers. The PWM hardware module will thus select the previous commands and generate the same PWM signals as the previous cycle. If the software runs partially overtime and the PWM hardware module selects inconsistent values, the PWM signals will be a combination of new (the PWM commands being copied at first update order) and previous (the PWM commands to be copied at second update order but not yet copied), which will result in a longer than nominal deadtime.

Figure 8:
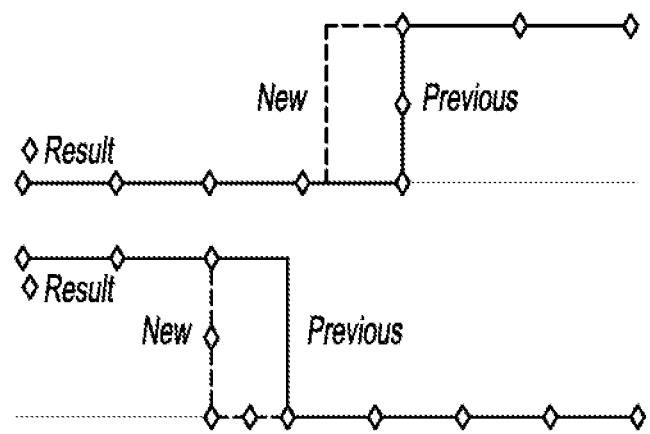
FIG. 8 are traces with increased dead time resulting from pulse width modulated signals for the lower switch being updated in a current cycle, and pulse width modulated signals for the upper switch being updated in a next cycle.

Referring to FIG. 8, the lower PWM commands are copied at first update order. The final PWM result would be the combination of the new lower switch commands and previous upper switch commands, with no shoot-through conditions.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure.

As previously described, the features of various embodiments can be combined to form further embodiments that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A powertrain system comprising:
   a traction battery;
   an electric machine;
   a power converter configured to transfer energy between the traction battery and electric machine, and including an upper switch and a lower switch forming a phase leg; and
   a controller programmed to sequentially update a next cycle pulse width modulation command for each of the upper switch and lower switch according to an order defined by whether the next cycle pulse width modulation command for one of the switches rises earlier than a previous cycle pulse width modulation command for the one of the switches.

2. The powertrain system of claim 1, wherein the order is to first update the next cycle pulse width modulation command for the lower switch and then update the next cycle pulse width modulation command for the upper switch when the next cycle pulse width modulation command for the upper switch will rise earlier than the previous cycle pulse width modulation command for the upper switch.

3. The powertrain system of claim 1, wherein the order is to first update the next cycle pulse width modulation command for the upper switch and then update the next cycle pulse width modulation command for the lower switch when the next cycle pulse width modulation command for the upper switch will rise later than the previous cycle pulse width modulation command for the upper switch.

4. The powertrain system of claim 1, wherein the order is to first update the next cycle pulse width modulation command for the upper switch and then update the next cycle pulse width modulation command for the lower switch when the next cycle pulse width modulation command for the lower switch will rise earlier than the previous cycle pulse width modulation command for the lower switch.

5. The powertrain system of claim 1, wherein the order is to first update the next cycle pulse width modulation command for the lower switch and then update the next cycle pulse width modulation command for the upper switch when the next cycle pulse width modulation command for the lower switch will rise later than the previous cycle pulse width modulation command for the lower switch.

6. The powertrain system of claim 1, wherein the power converter is a variable voltage converter.

7. The powertrain system of claim 1, wherein the power converter is a traction motor drive.

8. A method comprising:
sequentially updating a next cycle pulse width modulation command for each of an upper switch and lower switch of a phase leg of a power converter according to an order defined by timing of a rising edge of the next cycle pulse width command for one of the switches relative to a rising edge of a previous cycle pulse width command for the one of the switches.

9. The method of claim 8, wherein the order is to first update the next cycle pulse width modulation command for the lower switch and then update the next cycle pulse width modulation command for the upper switch when the next cycle pulse width modulation command for the upper switch will rise earlier than the previous cycle pulse width modulation command for the upper switch.

10. The method of claim 8, wherein the order is to first update the next cycle pulse width modulation command for the upper switch and then update the next cycle pulse width modulation command for the lower switch when the next cycle pulse width modulation command for the upper switch will rise later than the previous cycle pulse width modulation command for the upper switch.

11. The method of claim 8, wherein the order is to first update the next cycle pulse width modulation command for the upper switch and then update the next cycle pulse width modulation command for the lower switch when the next cycle pulse width modulation command for the lower switch will rise earlier than the previous cycle pulse width modulation command for the lower switch.

12. The method of claim 8, wherein the order is to first update the next cycle pulse width modulation command for the lower switch and then update the next cycle pulse width modulation command for the upper switch when the next cycle pulse width modulation command for the lower switch will rise later than the previous cycle pulse width modulation command for the lower switch.

13. A control system for a power converter including a phase leg having an upper switch and a lower switch, comprising:
a controller programmed to first update a next cycle pulse width modulation command for the lower switch and then update the next cycle pulse width modulation command for the upper switch responsive to timing of the next cycle pulse width modulation command for the upper switch indicating an earlier rise than the previous cycle pulse width modulation command for the upper switch.

14. The control system of claim 13, wherein the controller is further programmed to first update the next cycle pulse width modulation command for the upper switch and then update the next cycle pulse width modulation command for the lower switch responsive to timing of the next cycle pulse width modulation command for the upper switch indicating a later rise than the previous cycle pulse width modulation command for the upper switch.

15. The control system of claim 13, wherein the controller is further programmed to first update the next cycle pulse width modulation command for the upper switch and then update the next cycle pulse width modulation command for the lower switch responsive to timing of the next cycle pulse width modulation command for the lower switch indicating an earlier rise than the previous cycle pulse width modulation command for the lower switch.

16. The control system of claim 13, wherein the controller is further programmed to first update the next cycle pulse width modulation command for the lower switch and then update the next cycle pulse width modulation command for the upper switch responsive to timing of the next cycle pulse width modulation command for the lower switch indicating a later rise than the previous cycle pulse width modulation command for the lower switch.

17. The control system of claim 13, wherein the power converter is a variable voltage converter or a traction motor drive.

* * * * *